(12) United States Patent
Jonnalagadda et al.

(10) Patent No.: US 10,654,103 B2
(45) Date of Patent: May 19, 2020

(54) METHOD OF MANUFACTURING A FIN STRUCTURE FOR HEAT EXCHANGER

(71) Applicant: General Electric Company, Schenectady, NY (US)

(72) Inventors: Dattu G. V. Jonnalagadda, Bengaluru (IN); Srinivasan Swaminathan, Bengaluru (IN); Yanzhe Yang, Beavercreek, OH (US); Ramana Reddy Kollam, Bengaluru (IN); Merin Sebastian, Bengaluru (IN); Emily Phelps, Dayton, OH (US)

(73) Assignees: General Electric Company, Schenectady, NY (US); Unison Industries, LLC, Jacksonville, FL (US)

( * ) Notice: Subject to any disclaimer, the term of this patent is extended or adjusted under 35 U.S.C. 154(b) by 0 days.

(21) Appl. No.: 16/136,304

(22) Filed: Sep. 20, 2018

(65) Prior Publication Data
US 2020/0094324 A1    Mar. 26, 2020

(51) Int. Cl.
| | |
|---|---|
| *B22F 3/24* | (2006.01) |
| *B33Y 10/00* | (2015.01) |
| *B33Y 40/00* | (2020.01) |
| *B33Y 70/00* | (2020.01) |
| *B33Y 80/00* | (2015.01) |
| *B22F 3/00* | (2006.01) |
| *C23F 1/20* | (2006.01) |
| *C23F 1/00* | (2006.01) |
| *C23F 1/36* | (2006.01) |
| *F28F 21/08* | (2006.01) |
| *F28F 21/00* | (2006.01) |
| *H01L 23/36* | (2006.01) |
| *H01L 23/367* | (2006.01) |

(52) U.S. Cl.
CPC ............ *B22F 3/24* (2013.01); *B22F 3/008* (2013.01); *B33Y 10/00* (2014.12); *B33Y 40/00* (2014.12); *B33Y 70/00* (2014.12); *B33Y 80/00* (2014.12); *C23F 1/00* (2013.01); *C23F 1/20* (2013.01); *C23F 1/36* (2013.01); *F28F 21/00* (2013.01); *F28F 21/08* (2013.01); *F28F 21/081* (2013.01); *F28F 21/084* (2013.01); *H01L 23/36* (2013.01); *H01L 23/3672* (2013.01); *B22F 2003/247* (2013.01); *B22F 2301/052* (2013.01)

(58) Field of Classification Search
None
See application file for complete search history.

(56) References Cited

U.S. PATENT DOCUMENTS

| | | | |
|---|---|---|---|
| 4,136,026 A | 1/1979 | Meyer et al. | |
| 4,846,267 A | 7/1989 | Shattes et al. | |
| 5,091,046 A | 2/1992 | Hunter | |
| 5,961,771 A * | 10/1999 | Jurisich | C23F 1/08 156/345.23 |
| 6,306,226 B1 * | 10/2001 | Iino | B05D 7/51 148/247 |

(Continued)

FOREIGN PATENT DOCUMENTS

WO     2016059547 A2    4/2016

*Primary Examiner* — Jiong-Ping Lu
(74) *Attorney, Agent, or Firm* — Dority & Manning, P.A.

(57) ABSTRACT

The present disclosure discloses a method of manufacturing a structure with a wall, comprising manufacturing a structure with a wall by using additive manufacturing technology, and dissolving a surface of the wall for reducing thickness of the wall.

15 Claims, 6 Drawing Sheets

(56) References Cited

U.S. PATENT DOCUMENTS

| | | |
|---|---|---|
| 7,810,552 B2 | 10/2010 | Slaughter |
| 7,836,597 B2 | 11/2010 | Datta et al. |
| 9,638,471 B2 | 5/2017 | Neumann et al. |
| 2006/0231238 A1 | 10/2006 | Ball, Jr. |
| 2014/0246183 A1 | 9/2014 | Loebig |
| 2014/0284038 A1 | 9/2014 | Vedula et al. |
| 2015/0184539 A1 | 7/2015 | Maier et al. |
| 2016/0202101 A1* | 7/2016 | Sparks ..................... C25F 3/16 73/861.355 |
| 2017/0174987 A1 | 6/2017 | Nansen et al. |

* cited by examiner

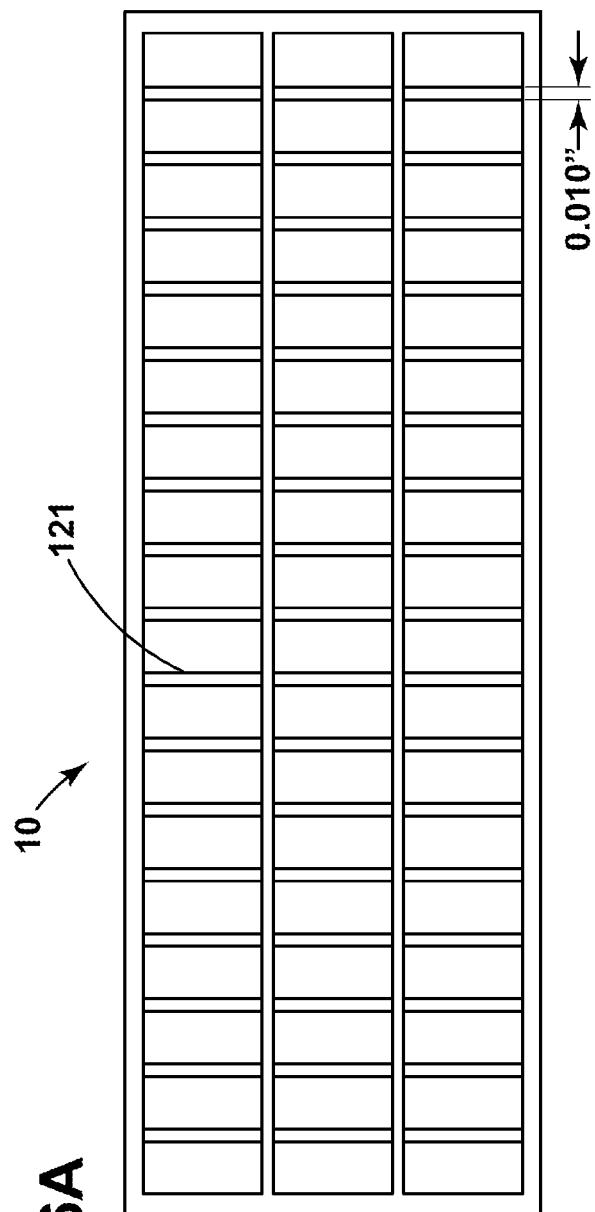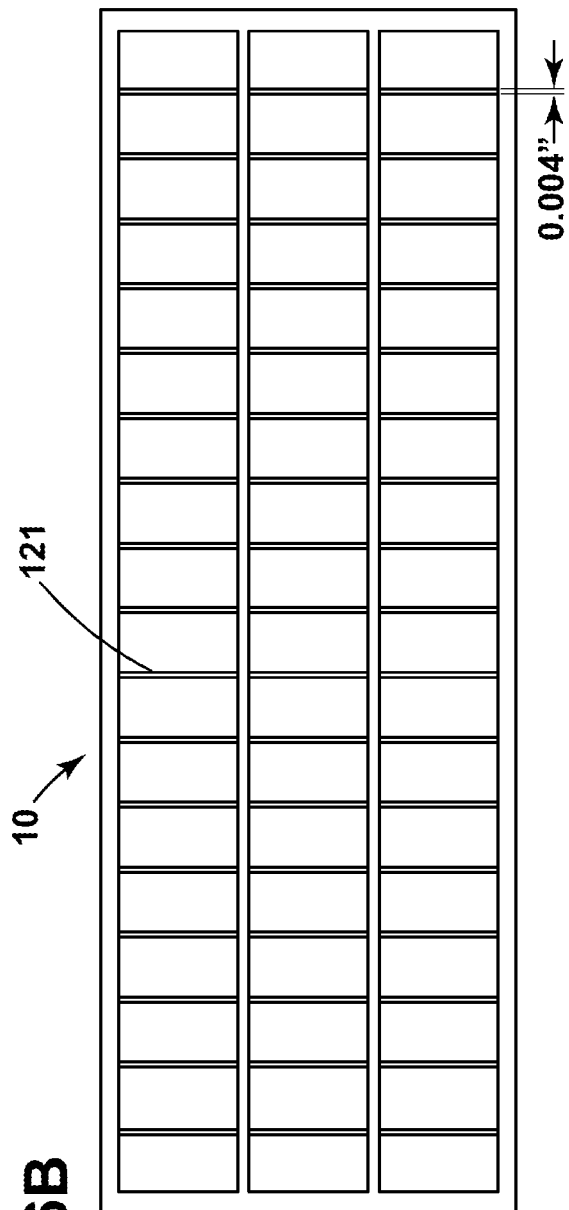

METHOD OF MANUFACTURING A FIN STRUCTURE FOR HEAT EXCHANGER

BACKGROUND

This disclosure relates generally to manufacture process, and more particularly to a method of manufacturing a fin structure.

For manufacturing a fin structure, thin rolled sheets are usually used. Heat exchangers may utilize such structures and are key components in aircraft engine for managing temperatures of various fluids like lubrication oil, fuel, generator cooling fluid, air, and the like. Conventional heat exchangers are manufactured through a fabrication process where ultra-thin rolled sheets are used to make and stack the fin structures. Conventional manufacturing process by using rolled sheets allows 4-5 mils thick fins. These fin structures are then attached to the main heat exchanger fluid channels through brazing process.

Due to reliability issues with braze joints, manufacture of the traditional heat exchangers is transitioning to using additive manufacturing technology. Current additive manufacturing technologies have limitations on feature sizes that can be produced, for example, a limit on wall or fin structure size. This limit is a thickness of 15 mils. As fins contribute to major portion of heat exchanger weight, any increase or excessive fin thickness can severely impact the overall heat exchanger mass. Also, higher fin thickness results in higher pressure loss and reduced heat exchanger performance.

BRIEF DESCRIPTION

In one embodiment, the present disclosure provides a method of manufacturing a structure with a wall, comprising manufacturing a structure with a wall by using additive manufacturing technology, and dissolving a surface of the wall for reducing thickness of the wall.

In another embodiment, the present disclosure provides a method of manufacturing a fin structure with a wall, comprising manufacturing a fin structure with a wall by using additive manufacturing technology, and dissolving a surface of the wall of the fin structure for reducing thickness of the wall.

In another embodiment, the present disclosure provides a method of manufacturing a heat exchanger comprising a fin structure with a wall, comprising manufacturing the heat exchanger by using additive manufacturing technology, and dissolving a surface of the wall of the fin structure for reducing thickness of the wall.

DRAWINGS

These and other features, aspects, and advantages of the present disclosure will become better understood when the following detailed description is read with reference to the accompanying drawings in which like characters represent like parts throughout the drawings, wherein.

Figure 7A:
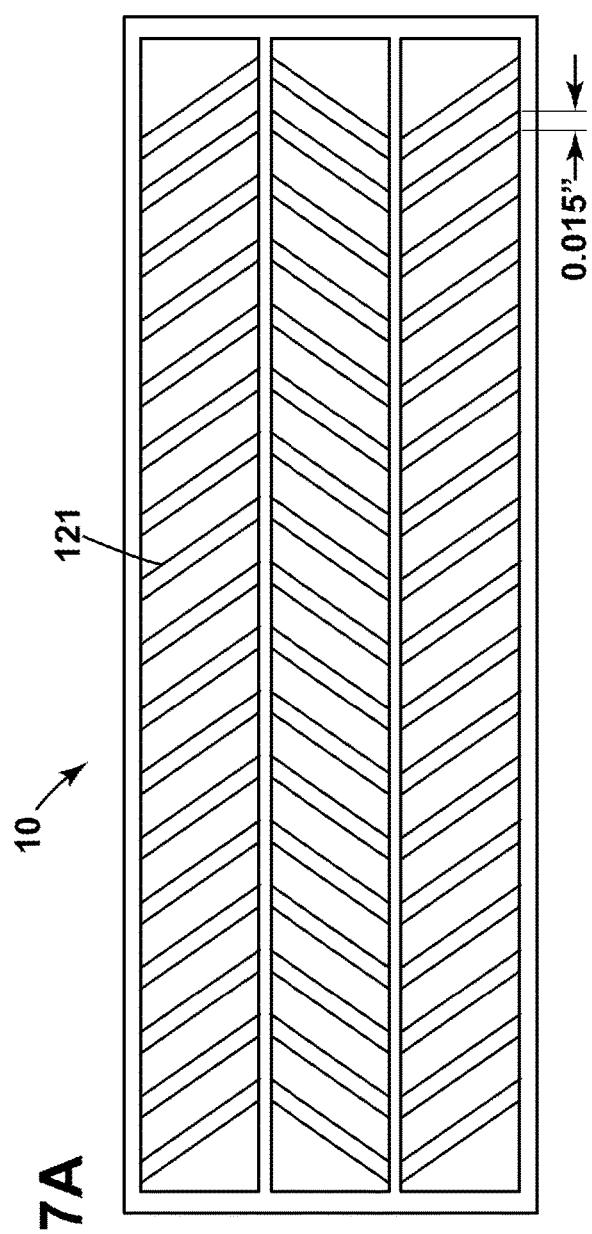
Figure 7B:
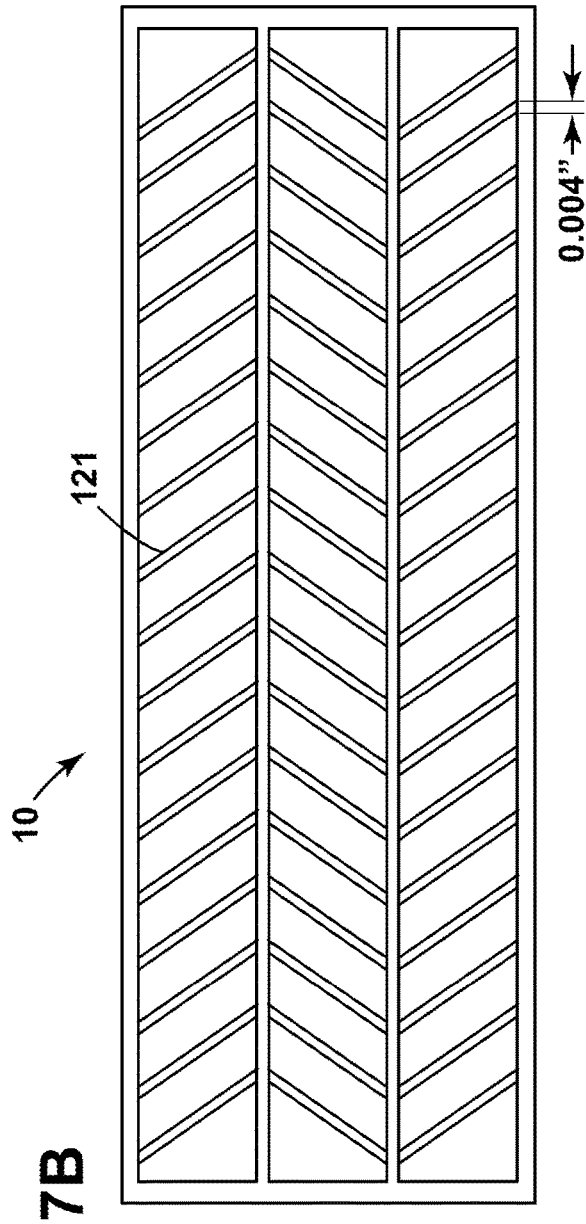
Figure 8A:
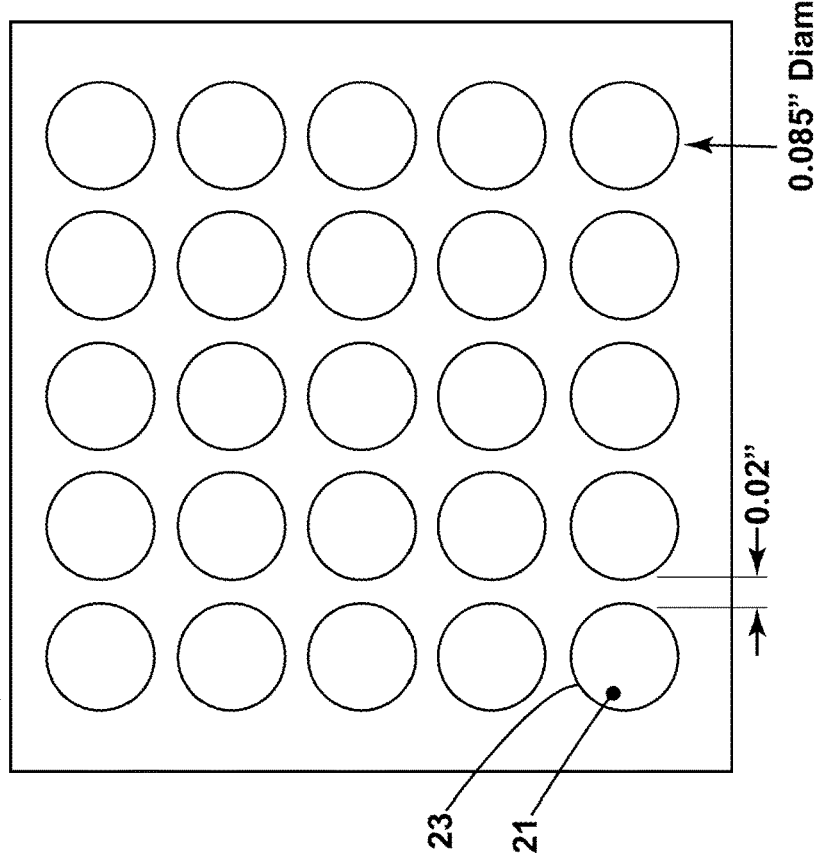
Figure 8B:
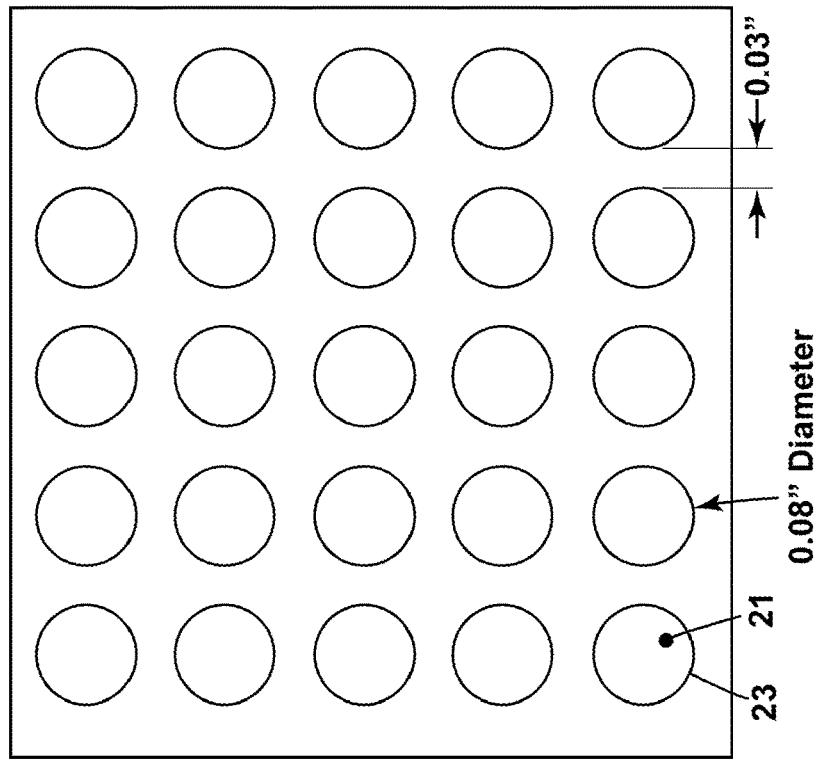

FIG. 6*a* shows an additively printed straight fins, and FIG. 6*b* shows the straight fins after the dissolving process, in accordance with an embodiment of the present disclosure;

FIG. 7*a* shows an additively printed inclined fins, and FIG. 7*b* shows the inclined fins after an etching process, in accordance with an embodiment of the present disclosure; and FIG. 8*a* shows an additively printed circular core heat exchanger, and FIG. 8*b* shows the circular core heat exchanger after an etching process, in accordance with an embodiment of the present disclosure.

DETAILED DESCRIPTION

Embodiments of the present disclosure will be described herein below with reference to the accompanying drawings. In the following description, well-known functions or constructions are not described in detail to avoid obscuring the disclosure in unnecessary detail.

Unless defined otherwise, technical and scientific terms used herein have the same meaning as is commonly understood by one of ordinary skill in the art to which this disclosure belongs. The terms "first," "second," and the like, as used herein do not denote any order, quantity, or importance, but rather are used to distinguish one element from another. Also, the terms "a" and "an" do not denote a limitation of quantity, but rather denote the presence of at least one of the referenced items. The terms such as "front," "back," "bottom," and/or "top," unless otherwise noted, are merely used for convenience of description, and are not limited to any one position or spatial orientation. The term "or" is meant to be inclusive and mean either or all of the listed items. The use of "including," "comprising," or "having" and variations thereof herein are meant to encompass the items listed thereafter and equivalents thereof as well as additional items. The terms "connected" and "coupled" are not restricted to physical or mechanical connections or couplings, and can include electrical connections or couplings, whether direct or indirect.

In the present disclosure, additive manufactured heat exchangers are used to replace conventional heat exchangers. However, the limitation of current additive manufacturing process is the minimum thickness of the fin structure. The minimum thickness that can be printed with current technology is more than 9 mils which is double the conventional fin thickness. As fins are major elements of heat exchanger this thickness limitation will substantially increase the overall heat exchanger weight. The present disclosure a method of manufacturing a fin structure or a heat exchanger, which can address the limitation of the thickness problem in additive manufacturing process.

Figure 1:
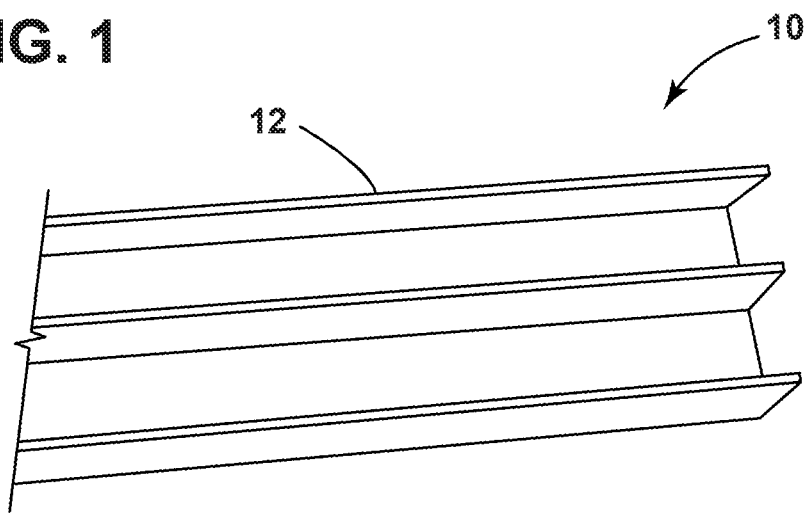
FIG. 1 is a perspective view of a fin structure, in accordance with an embodiment of the present disclosure.
Figure 2:
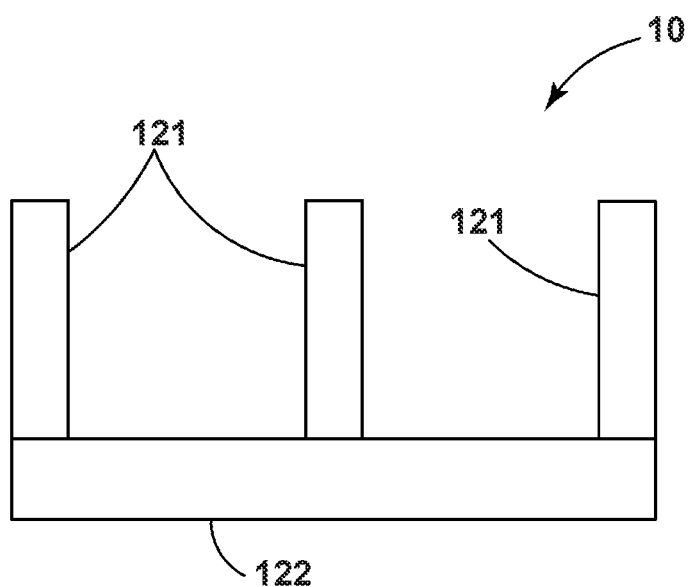
FIG. 2 is a sectional view of a fin structure, in accordance with an embodiment of the present disclosure.

Referring to FIG. 1 and FIG. 2 of the drawings, a fin structure 10 with walls 12 having upright walls 121 and a bottom wall 122 is shown. The fin structure 10 is made with additive manufacturing technology, and the walls are thicker than the desired thickness. Referring to the drawings of FIG. 3 and FIG. 4, a heat exchanger 20 with a fin structure 10 is shown. The heat exchanger comprises a core 22 having passages 21 thereinside with surrounding walls 23 for allowing the fluid passing through and a fin structure 10 for dissipating heat of the fluid passing through the core 22. The heat exchanger 20 with core 22 is made with additive manufacturing technology. The additive manufacturing technology may be Electron beam melting (EBM), Selective Laser Melting (SLM), Direct metal laser melting, (DMLM), binder jet, Infrared melting technology or other any other suitable additive manufacturing technology.

Figure 3:
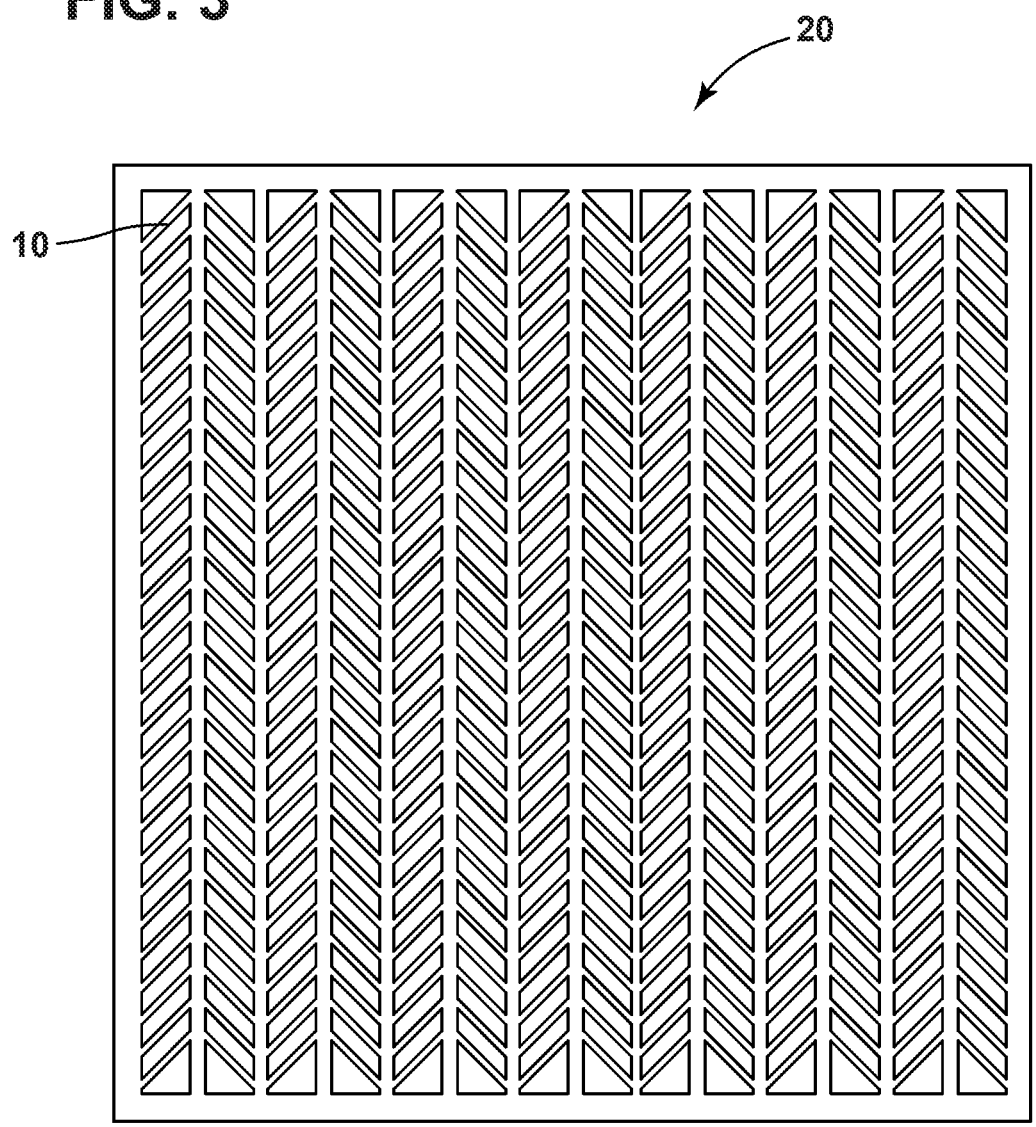
FIG. 3 is a top view of a heat exchanger, in accordance with an embodiment of the present disclosure.
Figure 4:
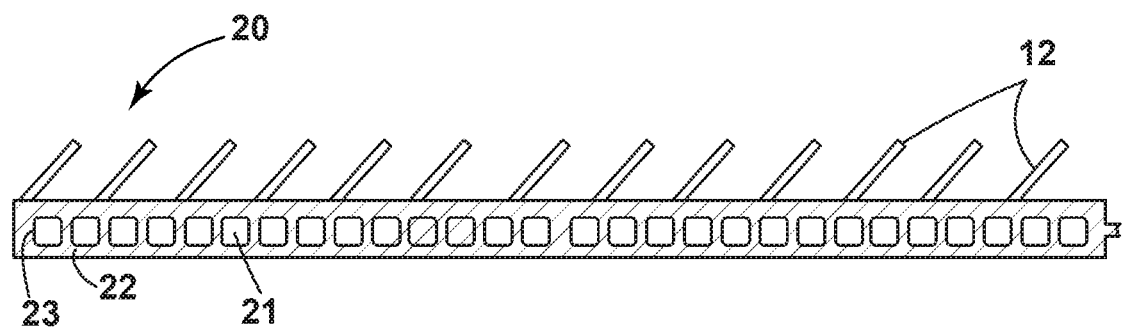
FIG. 4 is a sectional view of heat exchanger, in accordance with an embodiment of the present disclosure.
Figure 5:
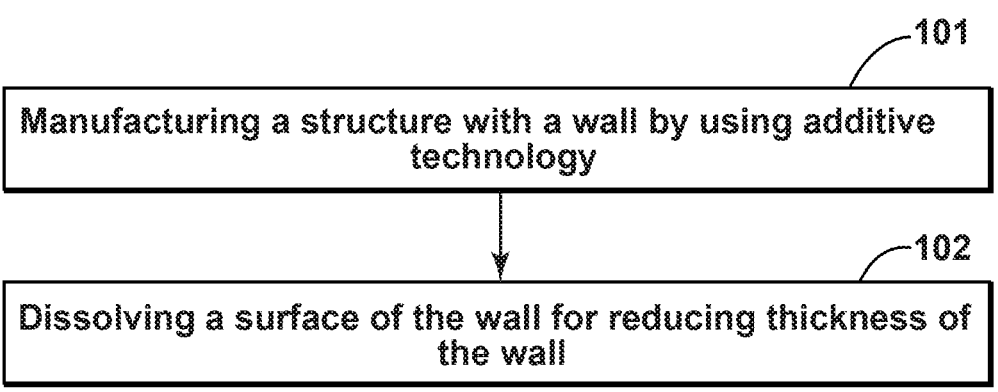
FIG. 5 shows a method of manufacturing a structure with a wall, in accordance with an embodiment of the present disclosure.

Referring to FIG. 5 of the drawings, the present disclosure discloses a method of manufacturing a structure with a wall, comprising 101) manufacturing a structure with a wall by using additive manufacturing technology, 102) dissolving a surface of the wall 12 for reducing thickness of the wall. In one embodiment, as shown in FIG. 1 and FIG. 2, the structure may be a fin structure 10 for a heat exchanger 20. In this embodiment, dissolving a surface of the wall comprises dissolving a surface of the wall of the fin structure. In another embodiment, as shown in FIG. 3 and FIG. 4, the structure may be the heat exchanger 20 with a core 22 having passages 21 with surrounding walls 23. In this embodiment, dissolving a surface of the wall comprises dissolving a surface of a surrounding wall of a passage in a core of the heat exchanger.

In one embodiment, the step of 102) dissolving a surface of the wall for reducing the overall thickness of the wall comprises dissolving by 103) conducting an etching process applied to the wall or the structure. Before the etching process, the part that does not need to be etched can be covered with a protective layer, such as the bottom wall 122 of the fin structure in FIG. 1 and FIG. 2.

During the etching process, acidic and alkaline solutions are used to dissolve the surface of the wall or the structure made of metal and form appropriate salt. Then, the salt is removed by using running water or other solvents. Therefore, a wall with reduced uniform thickness is produced. For example, aluminum is the material of the wall or the structure, and aluminum can be easily dissolved by NaOH or KOH solutions. Implementing NaOH or KOH solutions for etching the aluminum wall or structure to reduce the thickness of the wall is cost effective and can be scaled to any requirements. In this embodiment, dry etching process or wet etching process may be used.

Hydrogen embrittlement may occur, when the hydrogen gas is evolved during the etching process. If hydrogen is not going to penetrate, the step of 102) dissolving a surface of the wall for reducing the thickness of the wall further comprises 104) baking the wall or the structure after step 103) of conducting an etching process applied to the wall or the structure, so that the hydrogen gas can be removed that would prevent hydrogen embrittlement. The baking temperature may be from 200~500° C., and the duration is 0-4 hours.

If hydrogen embrittlement occurs, the step of 102) dissolving a surface of the wall for reducing the thickness of the wall further comprises 105) neutralizing the surface of the wall or the structure with vinegar, acetic acid or other acids that would cause aluminum hydroxide formation by using alkaline material, and cleaning the products of neutralization by water or other solvents.

In another embodiment, the step of 102) dissolving a surface of the wall for reducing the thickness of the wall comprises 106) conducting a corrosion process to the wall or the structure.

During the corrosion process, acidic and alkaline solutions are used to dissolve the surface of the wall or the structure made of metal and form appropriate salt. For example, aluminum is the material of the wall or the structure, and NaOH or KOH solutions are used to corrode aluminum wall or structure to uniformly reduce the thickness of the wall, which is cost effective and can be scaled to any requirements.

During a corrosion process, the wall, on the order of nano-meters, gets corroded and forms an oxide layers on the surface of the metal wall. These oxide layers are then dissolved or washed away with some suitable solvents that would not form hydrogen gas and prevent embrittlement problem. Further, by baking process the hydrogen embrittlement can be prevented as discussed above.

In another embodiment, the step of 102) dissolving a surface of the wall for reducing the overall thickness of the wall comprises 107) conducting an electropolishing process to the wall or the structure.

Electropolishing with electrolyte solution can remove the surface of the wall or structure made of metal at a reasonable rate and result in formation of oxide layer that prevent hydrogen embrittlement. Salts formed by the electropolishing processes are washed by fluid circulation mechanisms. Continuous flow of etching solution washes away the formed salts from the critical location thus reducing the probability of forming thick salt deposits.

In one example, the electrolyte solution for electropolishing process may be a solution containing phosphoric acid 65-75 ml/L, sulfuric acid 5-10 ml/L, glycerin 1-15 ml/L, melamine 1-10 wt %, and hydrofluoric acid 1-5 ml/L. The parameters used in the electropolishing process are shown below. The temperature is 85° C., the voltage is 20V, the duration time is 5 minutes, the anode material is stainless steel, and the anode current is 25 A/dm$^2$.

In the experiments, commercially available aluminum alloy is used for a fin structure with three upright walls 121 and one bottom wall 122 as shown in FIG. 1. The thickness of the upright walls 121 is 29 mils and the thickness of the bottom wall is 32 mils. Commercially available NaOH is used for the etching process.

Experiment 1

Commercially available NaOH solution is used for the etching process. The etching process is uniform throughout the length of the walls. After 13 hours, the thickness of upright walls is from 6.5 to 7.5 mils.

Experiment 2

The NaOH solution is diluted by half from the experiment 1. The etching process is uniform throughout the length of the walls. After 17 hours, the thickness of upright walls is from 2.5 to 3.5 mils.

Experiment 3

The NaOH solution is diluted by half from the experiment 1. The etching process is uniform throughout the length of the walls. After 16 hours, the thickness of upright walls is from 9.5 to 11 mils.

Referring to FIGS. 6a and 6b of the drawings, FIG. 6a shows an additively printed straight fins with 0.010 inches thickness, FIG. 6b showed the chemically etched straight fins with reduced fin thickness of 0.004 inches.

Referring to FIGS. 7a and 7b of the drawings, FIG. 7a shows an additively printed inclined fins with 0.015 inches thickness, FIG. 7b showed the chemically etched inclined fins with reduced fin thickness of 0.004 inches.

Referring to FIGS. 8a and 8b of the drawings, FIG. 8a shows an additively printed circular core heat exchanger with wall thickness between the passages of 0.03 inches and the diameter of the circular passage 21 is 0.08 inches, FIG. 8b showed the chemically etched circular core heat exchanger with reduced wall thickness of 0.02 inches, and the diameter of the circular passage 21 is 0.0085 inches after the etching process of etching the surrounding walls 23 of the passages 21 of the heat exchanger core 22.

While the disclosure has been illustrated and described in typical embodiments, it is not intended to be limited to the details shown, since various modifications and substitutions can be made without departing in any way from the spirit of the present disclosure. As such, further modifications and equivalents of the disclosure herein disclosed may occur to persons skilled in the art using no more than routine experimentation, and all such modifications and equivalents are believed to be within the spirit and scope of the disclosure as defined by the following claims.

What is claimed is:

1. A method of manufacturing a structure with a wall, comprising:
    manufacturing a structure with a wall by using additive manufacturing technology; and
    dissolving a surface of the wall for reducing thickness of the wall comprising conducting an etching process on the wall and baking the wall.

2. The method of manufacturing a structure with a wall of claim 1, wherein the structure is made of aluminum alloy.

3. The method of manufacturing a structure with a wall of claim 1, wherein dissolving a surface of the wall for reducing the thickness of the wall further comprises neutralizing the surface of the wall with acid.

4. The method of manufacturing a structure with a wall of claim 1, wherein dissolving a surface of the wall for reducing the thickness of the wall comprises conducting a corrosion process on the wall.

5. The method of manufacturing a structure with a wall of claim 1, wherein dissolving a surface of the wall for reducing the thickness of the wall comprises conducting an electropolishing process on the wall.

6. A method of manufacturing a fin structure with a wall, comprising:
    manufacturing a fin structure with a wall by using additive manufacturing technology; and
    dissolving a surface of the wall of the fin structure for reducing thickness of the wall comprising conducting an etching process on the wall and baking the wall.

7. The method of manufacturing a fin structure with a wall of claim 6, wherein the fin structure is made of aluminum alloy.

8. The method of manufacturing a fin structure with a wall of claim 6, wherein dissolving a surface of the wall for reducing the thickness of the wall further comprises neutralizing the surface of the wall or the structure with acid.

9. The method of manufacturing a fin structure with a wall of claim 6, wherein dissolving a surface of the wall for reducing the thickness of the wall comprises conducting a corrosion process on the wall.

10. The method of manufacturing a fin structure with a wall of claim 6, wherein dissolving a surface of the wall for reducing the thickness of the wall comprises conducting an electropolishing process on the wall.

11. A method of manufacturing a heat exchanger comprising a fin structure with a wall, comprising:
    manufacturing the heat exchanger by using additive manufacturing technology; and
    dissolving a surface of the wall of the fin structure for reducing thickness of the wall comprising conducting an etching process on the wall and baking the wall.

12. The method of manufacturing a structure with a wall of claim 11, further comprising dissolving a surface of a surrounding wall of a passage in a core of the heat exchanger.

13. The method of manufacturing a structure with a wall of claim 11, wherein the fin structure is made of aluminum alloy.

14. The method of manufacturing a fin structure with a wall of claim 11, wherein dissolving a surface of the wall for reducing the thickness of the wall comprises conducting a corrosion process on the wall.

15. The method of manufacturing a fin structure with a wall of claim 11, wherein dissolving a surface of the wall for reducing the thickness of the wall comprises conducting an electropolishing process on the wall.

* * * * *